United States Patent [19]

Ohkawa

[11] Patent Number: 5,026,683
[45] Date of Patent: Jun. 25, 1991

[54] CERAMIC SUPERCONDUCTOR WIRE APPARATUS AND METHODS

[75] Inventor: Tihiro Ohkawa, La Jolla, Calif.

[73] Assignee: General Atomics, San Diego, Calif.

[21] Appl. No.: 264,324

[22] Filed: Oct. 27, 1988

[51] Int. Cl.$^5$ .................................................. B32B 9/00
[52] U.S. Cl. .................................... 505/1; 505/701; 505/702; 505/703; 505/704; 428/209; 428/457; 428/688; 428/930; 427/62; 29/599; 204/192.24
[58] Field of Search ................... 505/1, 701–704; 29/599; 428/209, 457, 688, 930; 427/62; 204/192.24

[56] References Cited

U.S. PATENT DOCUMENTS 4,826,808  5/1989  Yurek et al. .............................. 505/1
4,828,685  5/1989  Stephens ................................. 505/1

OTHER PUBLICATIONS

S. Jin et al., "High Tc Superconductors—Composite Wire Fabrication", Appl. Phys. Lett., 51, No. 3 (Jul. 20, 1987).
O. Kohno et al., "Characteristics of High-Tc Oxide Wire", Physica 148B, 429–431 (1987).
N. Sadakata et al., "Fabrication and Superconducting Properties of High Tc Oxide Wire", Mat. Res. Soc. Symp. Proc., 99 293–296 (1988).
H. Sekine et al., "Fabrication of Multifilamentary Y-Ba-Cu-O Oxide Superconductors", Appl. Phys. Lett., 52, No. 26, 27 (Jun., 1988).
M. Kavishma et al., "The Manufacturing Process and Properties of the High Tc Oxide Superconducting Wire", Applied Superconductivity Conference, San Francisco (1988).
G. A. Whitlow et al., "Silver Encases High Temperature Superconductor Ribbons Produced by Rolling", Pres. at Applied Superconductivity Conference, San Francisco (1988).
Y. Yamada et al., "Critical Current Density of Wire Type Y-Ba-Cu Oxide Superconductor", Japanese Jour. of Appl. Phys. 26, No. 5, L865-L866 (May, 1987).

Primary Examiner—Patrick J. Ryan
Attorney, Agent, or Firm—Nydegger & Associates

[57] ABSTRACT

A superconducting wire and a process for fabricating such a wire. The present invention relates specifically to the fabrication of a wire using a ceramic superconducting material. Initially, a quantity of highly pure high temperature superconducting material is obtained. The superconducting material may be fabricated by any one of a number of known fabrication methods such as by aqueous coprecipitation, conventional sol gel techniques or solid state reaction processes.

Once a ceramic superconducting material in particulate form is obtained, surface impurities on the particles are removed. One such surface cleaning procedure is known as "sputtering." Sputtering strips the surface atoms from the surface of the superconducting material, leaving only pure superconducting ceramic.

The superconductive ceramic produced according to the procedure outlined above is then used in the formation of a superconducting wire. There are alternative methods of manufacturing the wire, one of which is to obtain a hollow tube of a conventional conducting material such as gold, silver, copper, or aluminum. The tube is then filled with the cleansed particulate superconducting material.

In an alternative embodiment of the present invention, a solid wire is obtained. The superconducting ceramic is then electrostatically coated onto the wire by pulling the wire continuously through an environment of the superconducting ceramic. Particles of the superconducting material are caused electrostatically to adhere to the surface of the wire.

12 Claims, 1 Drawing Sheet

U.S. Patent          June 25, 1991          5,026,683
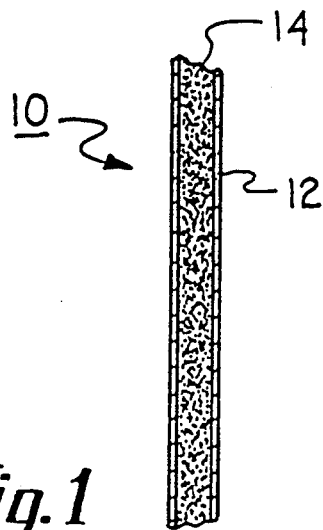
Fig.1
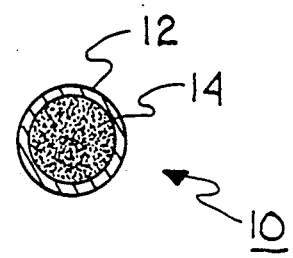
Fig.2
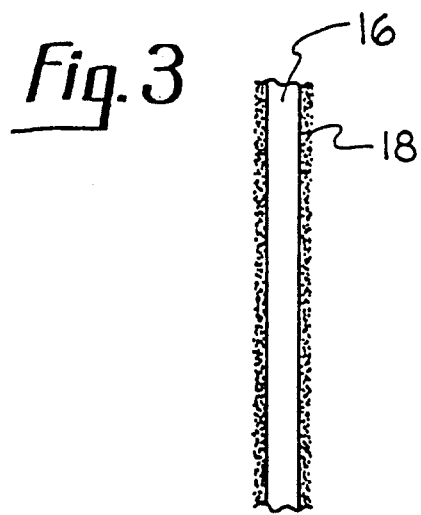
Fig.3
Fig.4
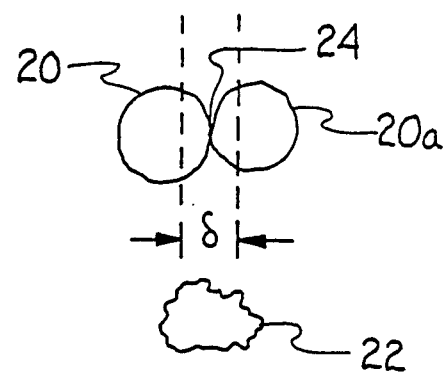
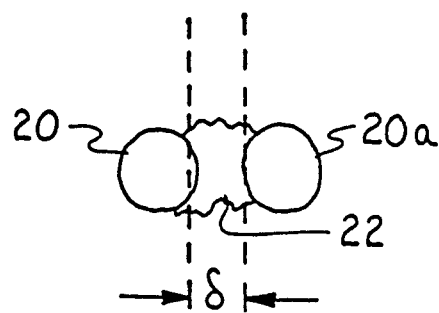
Fig.5

CERAMIC SUPERCONDUCTOR WIRE APPARATUS AND METHODS

BACKGROUND

1. The Field of the Invention

The present invention relates generally to a superconducting wire and methods for manufacturing such a wire. More particularly, the present invention relates to the formation of a superconducting wire using a ceramic material, but without the necessity of sintering the ceramic material.

2. The Background of the Invention

It is now generally recognized that superconducting materials hold a great deal of potential for the advancement of technology. For example, in remarks delivered on July 28, 1987 to the Federal Conference on Commercial Application of Superconductivity, the President of the United States stated that "to most of us laymen, superconductivity was a completely new term, but it wasn't long before we learned the great promise it held out to alter our world for the better—a quantum leap in energy efficiency that would bring with it a host of benefits, not least among them a reduced dependence on foreign oil, a cleaner environment, and a stronger national economy."

The phenomenon of superconductivity has been known since the early part of the twentieth century. Superconductivity is generally defined as a condition which exists when a material meets two tests. These tests include (1) zero dc electrical resistance, and (2) the so-called Meissner effect which comprises the expulsion of a magnetic field much as when one magnet repels another When these two conditions are met, materials are classified as superconducting and exhibit some unique properties, most notably zero resistance. It has generally been observed, however, that superconductivity occurs only at very low temperatures. The onset of superconductivity was typically not observed until temperatures dropped to the range of approximately 20° K. or less.

It is apparent that a material having zero resistance has many important potential applications. For example, there is the potential of providing superconducting electrical transmission lines which would be able to carry electricity without significant loss of electrical power. This would result in the savings of billions of dollars in transmission costs and would allow the development of energy generating facilities, such as nuclear power plants, which may be located great distances from urban centers.

It has also been pointed out that superconductivity may allow motors to be produced which are one-tenth of normal size. Those knowledgeable in the art have also speculated that superconductive materials would allow the production of high speed trains levitated by magnets, as well as the production of computers which would be smaller and faster than those presently known. It has also been predicted that new superconductive data transmission lines could be constructed that would carry one trillion bits of information per second, which is approximately 100 times faster than the fiber optic cables which carry many data transmissions and telephone calls at the present time.

The use of superconductivity in these types of devices is not entirely speculative. For example, it has now been reported that the Argonne National Laboratory constructed a liquid nitrogen cooled superconducting electrical motor during late 1987. In addition, certain types of superconducting materials have been known and employed for some time. Niobium superconducting products have been marketed and have been used in various contexts, such as superconducting magnets and in certain types of medical equipment.

One of the primary limitations on the development of superconducting products, such as motors, transmission lines, and the like, has been the fact that most materials are superconducting only at extremely low temperatures. In order to produce these extremely low temperatures it is necessary to employ very expensive liquid helium as a refrigerant. Clearly, the extremely low temperatures at which known materials become superconductive severely limit their usefulness in practical everyday applications.

Recently, however, it has been observed that certain types of materials, particularly specialized ceramics, exhibit superconductive properties at temperatures significantly above those of traditional superconducting materials. For example, a ceramic of lanthanum-copper-oxide doped with barium has been found to be superconducting above liquid helium temperatures. Research demonstrated that this type of ceramic material could be superconducting above 20° K. and even in the temperature range of liquid nitrogen (above 77° K.). Indeed, these types of superconducting materials have recently been referred to as "90° K. superconductors" because of the fact that superconductivity has been observed in the 90° K. range.

These types of materials are often referred to in the art as "high temperature superconducting materials." That is, they exhibit superconducting properties at temperatures obtainable using liquid nitrogen. These superconductors are important because the production of liquid nitrogen is relatively inexpensive and its use is relatively simple.

In early 1986, a compound having the general chemical formula $La_{2-x}Ba_xCuO_4$ was found to exhibit onset of superconductivity near 30° K.. Subsequently, findings were reported with a compound comprised of yttrium, barium, copper and oxygen ($YBa_2Cu_3O_7$) exhibiting superconductivity in the 80° K. to 93° K. range, temperatures well within the range obtainable using liquid nitrogen.

Due to the progressive increase in temperature at which superconductivity is found to exist, it has been suggested that superconductivity may ultimately be found at or near room temperature. Such a development would clear the way for practical application of superconductors in many contexts not yet explored.

Superconducting materials of the type referred to above generally exist as ceramics. This fact has been another limitation on the extensive use of these materials. Ceramics are not easily moldable and usable in forms generally used in electrical equipment and ceramics cannot generally be treated in the same manner as metal wires and the like. Thus, one of the difficulties and limitations in the application of ceramic superconductive materials has been the inability to place those materials in a usable form.

An additional problem encountered in ceramic superconductors is the general necessity of sintering the ceramic material before it is used. In order to form a coherent ceramic superconducting material it is the general process to sinter the material before use. Sintering is generally defined as a process whereby a coherent mass of material is obtained by heating the material, causing interconnections between adjacent grains, but without melting the material.

The problem with sintering is, however, that impurities within the ceramic are permanently incorporated within the sintered ceramic. For example, impurity phases which are not superconducting may be melted during the sintering process. Following sintering the impurity phase is often found to coat the grains of the superconducting ceramic. This coating interrupts the structure of the superconducting material. Furthermore, it prevents the grain-to-grain contact that is critical in producing high critical current density superconducting material.

Thus, it is found that upon sintering, ceramic materials may lose some superconductive performance, and may have reduced critical current densities at liquid nitrogen temperatures.

Accordingly, it would be a substantial advancement in the art to provide a very pure superconducting material which was free of surface impurities. It would also be an advancement in the art to provide methods for manufacturing a superconducting ceramic which included means for removing surface impurities. It would be a related advancement in the art to provide a superconducting wire made of a ceramic which did not require sintering during the initial stages of formation. It would be another advancement in the art to provide a superconducting wire that could be used in much the same manner as traditional metal wires are used. It would also be an advancement in the art to provide a superconducting wire and methods for its production which preserve surface contact between the grains of the ceramic superconducting material.

Such methods and apparatus are disclosed and claimed herein.

BRIEF SUMMARY AND OBJECTS OF THE INVENTION

The present invention is related to a superconducting wire and a process for fabricating such a wire. The present invention relates specifically to the fabrication of a wire using a ceramic superconducting material. The ceramic superconducting material is then placed in contact with an elongated support structure such as within an elongated metal tube.

Initially, a quantity of highly pure high temperature superconducting material is obtained. Preferably, the superconducting material is a ceramic which exists in a particulate or granule form. The superconducting material may be fabricated by any one of a number of known fabrication methods. For example, the superconducting material may be produced by an aqueous coprecipitation process similar to that described by Chin et al., "High Purity Superconducting Compositions and Methods for their Fabrication," U.S. patent application Ser. No. 221,995 filed Aug. 10, 1988. Also, see C. T. Chu et al., Journal of the American Ceramic Society 70, C-375 (1987).

Alternatively, the ceramic superconducting material may be formed by conventional "sol gel" techniques which are well known in the art. For example, see G. Kordas et al., Materials Letters 5, 417 (1987). Other conventional techniques also exist in the art and may be used to provide the ceramic superconducting material of the present invention. For example, the formation of a composite material has been described wherein high purity powders of $Y_2O_3$, $BaCO_3$ and $CuO$ are mixed together in the proper ratios and then calcined at approximately 900° to 950° C. This technique is known to produce superconducting powder of $YBa_2Cu_3O_7$. See, for example, X. D. Chen et al., Review of Scientific Instruments 58, 1565–1571 (1987).

Once a ceramic superconducting material in particulate form is obtained, surface impurities on the particles are removed. Any type of highly effective surface cleaning procedure may be employed. It is necessary, however, that essentially all surface impurities be removed from the material.

One such surface cleaning procedure is known as "sputtering." Sputtering can be achieved by placing the particulate superconducting material in a fluidized bed to ensure that the particles are all separate. An atmosphere which includes oxygen and a noble gas, such as argon, is introduced to the fluidized bed. The noble gas is then placed in an excited state, such as by bombarding the gas with microwaves, causing the production of a plasma. The plasma of noble gas then in turn "sputters" or bombards the surface atoms carried by the ceramic. This bombardment strips the surface atoms from the surface of the superconducting material, leaving only pure superconducting ceramic. The "sputtered" or removed atoms are then removed from the chamber by the gaseous atmosphere.

Once the sputtering process is completed, highly pure particles of superconducting material remain, facilitating good grain-to-grain contact between the particles. Good grain-to-grain contact is required in order to produce high critical current density superconductors at cryogenic temperatures.

The granules or particles of superconducting material are then sorted according to size. Only those particles of the ideal size to produce superconductivity are used to produce the superconducting wire. Further, the other particles can be treated until they meet the required specifications.

The superconducting ceramic produced according to the procedure outlined above is then used in the formation of a superconducting wire. There are alternative methods of manufacturing the wire, one of which is to obtain a hollow tube of a conventional conducting material such as gold, silver, copper or aluminum. The tube is then filled with the cleansed particulate superconducting material.

Once the superconducting material is introduced within the tube it is generally desirable to physically contract the tube in order to securely hold the superconducting particles in place, and to achieve good grain-to-grain contact between the particles. Contraction can be accomplished by heating the tube and the superconducting material, while causing the superconducting material to be tightly compacted within the tube. The tube is then drawn by conventional techniques in order to restrict its diameter. Thus, when the tube cools, differential contraction causes the tube to exert pressure on the particles and produce extensive contact among the grains.

In some cases, once the wire has been formed it may be preferable to obtain greater interaction between the superconducting particles. Accordingly, at this point the superconducting material may be sintered if desired. Because all surface impurities have been previously removed, sintering is accomplished without the detrimental effects mentioned above.

In an alternative embodiment of the present invention, a solid rod or wire is obtained. The wire is coated with insulating material. The superconducting ceramic is then electrostatically coated onto the wire by pulling the wire continuously through an environment of the superconducting ceramic. Particles of the superconducting material are caused electrostatically to adhere to the surface of the wire.

It will be appreciated that the present invention takes advantage of the superconducting characteristics of the material in a manner that is usable in conventional applications. Placing the superconducting material in contact with the elongated support structure, such as a tube or solid wire, facilitates use of the material in conventional applications. The metal wire or tube provides a parallel conductive path to carry current in case of a local loss of superconductivity. The wire also provides thermal stabilization (heat sinking) to minimize local heating and resulting loss of superconductivity. Furthermore, the wire also provides mechanical protection for the brittle ceramic. Thus, the wire can be used in many environments where ceramics would not be usable. At the same time, the disadvantages of sintering are avoided.

It is, therefore, a general object of the present invention to provide a superconducting material which is pure and from which surface impurities have been removed.

It is also an object of the present invention to provide means for cleaning the surface of superconducting ceramic particles.

It is also an object of the present invention to provide a superconducting wire employing the cleansed ceramic particles.

It is a further object of the present invention to provide a superconducting wire without the necessity of sintering the ceramic during the initial stages of formation.

It is another object of the present invention to preserve sufficient contact between the superconducting particles to preserve superconductivity within the wire.

These and other objects of the present invention will become apparent upon reference to the following detailed description of the preferred embodiments, the drawings, and the claims.

BRIEF DESCRIPTION OF THE DRAWINGS

FIG. 1 is a longitudinal cross-sectional view of a wire containing superconducting material within its interior;

FIG. 2 is a transverse cross-sectional view of the wire illustrated in FIG. 1;

FIG. 3 is a longitudinal cross-sectional view of a wire having superconducting material coated on its exterior;

FIG. 4 is a schematic cross-sectional representation of two particles of superconducting material and a particle of impurity before sintering; and FIG. 5 is a schematic cross-sectional representation of two particles of superconducting material and one particle of impurity after sintering.

DETAILED DESCRIPTION OF THE PREFERRED EMBODIMENTS

The present invention is related to methods and apparatus for producing a superconducting wire. The present invention relates specifically to the fabrication of a flexible wire using a ceramic superconducting material. In a preferred embodiment of the present invention the superconducting wire is fabricated using a superconductor of the type $MBa_2Cu_3O_{7-x}$, where M is yttrium or a rare earth element, and x is between approximately 0 and 0.2.

Generally, the process of forming superconducting materials of the type described above requires sintering in order to form a coherent ceramic. The sintering process, however, often leads to contamination within the ceramic. Specifically, contaminants are found to become incorporated between the grains of the superconducting material, thus resulting in low critical current density within the superconducting material. The present invention provides methods and apparatus for avoiding such contamination.

The present invention teaches the formation of a superconducting wire produced by generating a highly pure and stoichiometric superconducting material. The grains of the superconducting material are cleaned by surface sputtering or other equivalent surface cleaning technique. The cleansed particles are then sorted by size in order to obtain the optimum size and configuration of material for use in the wire. Once the particles are sorted, the optimum sized particles are loaded within a metal tube, or are coated onto the outside of a solid shaft in order to form the wire.

Preferably, a superconducting ceramic of the type $YBa_2Cu_3O_7$ is obtained. However, other equivalent superconductive ceramics may also be employed. The ceramic is made in any conventional manner. For example, the ceramic may be made by known and conventional sol gel techniques. Alternatively, an aqueous coprecipitation process can be used. As a further alternative, a ceramic material can be made by the formation of a composite wherein powders of $Y_2O_3$, $BaCO_3$, and $CuO$ are mixed together and then calcined.

Any of the above processes may be used in order to produce the superconducting ceramic. Indeed, as mentioned above, other types of ceramics may also be used to produce the same type of superconducting wire. For the purposes of the present invention it is only necessary that a superconducting ceramic be obtained which exists in particulate or granular form and which is relatively high in purity.

Once the particulate superconducting material is obtained, it is placed in a fluidized bed reaction chamber. Fluidized bed reaction chambers are well known and conventional in the art. Fluidized bed reaction chambers have the effect of separating the individual ceramic particles.

While within the fluidized bed reaction chamber the superconducting material is heated in the presence of oxygen, and possibly one or more noble gasses, to approximately 750° C. and then gradually cooled in the presence of oxygen. It is generally found that at approximately 450° C. the ceramic material reaches a stage where the oxygen content of the ceramic is optimized. At this point the ceramic exists in the orthorhombic configuration. It is presently believed that the material is transformed from the tetragonal to the orthorhombic state during the cooling process. Again, however, it is only necessary that the ceramic achieve a configuration and oxygen content which is desirable for the specific situation.

The fluidized bed configuration ensures that each particle remains separate through the entire heating and cooling process. Each particle is heated and surrounded by an atmosphere of oxygen during this procedure. Thus, an ideal oxygen content of the resulting ceramic material can be obtained. Deviation from the stoichiometric proportion of the oxides or surface degradation caused by reaction of the superconducting particles with $H_2O$ and/or $CO_2$ in the atmosphere may lead to a surface covered by non-superconducting oxides. This phenomenon is avoided using the fluidized bed reaction chamber process described above.

In order to obtain an effective superconducting material, while avoiding sintering during the early stages, it is necessary to make certain that all surfaces of the superconducting particles are clean and free from impurities. Cleaning of the surface of the superconducting particles is accomplished by any effective surface cleaning technique such as "sputtering" the particles.

In one embodiment of the present invention, the fluidized bed reaction chamber containing the particles of super-conducting ceramic is filled with an atmosphere of noble gas mixed with oxygen. This atmosphere can be identical or essentially identical to that used in the heating and cooling process described above. The gas is then excited to form a plasma. The fluidized bed reaction chamber, for example, is bombarded by microwaves having sufficient intensity to cause the gas within the fluidized bed reaction chamber to break down.

It is found that noble gas ions, such as argon, are very effective in sputtering the surface atoms of the superconducting material. During this process, the ceramic superconducting particles are bombarded by the plasma produced in the reaction chamber. This in turn causes atoms on the surface of the particle to be dislodged and removed. During the process, the ceramic superconducting particles become smaller because of loss of surface atoms. At the same time surface impurities on the exterior of the particles are removed, leaving a clean surface and stoichiometrically consistent particles having the same composition from the exterior to the center.

Following the sputtering or other surface cleaning procedure, the atmosphere containing the sputtered atoms is removed and the resulting particles are inspected. Any one of various conventional chemical surface inspection techniques is employed. For example, X-ray photoemission spectroscopy or Auger electron spectroscopy are preferably used to inspect the surface.

Following cleaning and inspection, the particles are sorted according to size. The particles may be placed in a vibrator such that small particles settle toward the bottom of the container, with the large particles remaining on top. Alternatively, conventional centrifuge arrangements can be employed which sort particles by size. In addition to centrifugation or the like, it may be desirable to further sort the particles magnetically in order to remove any non-superconducting particles.

As will be discussed in further detail below, it is necessary that the particles remain within a certain size range in order to provide good superconductive characteristics. Accordingly, large particles which fall outside this range will be sent back to the sputtering chamber, or their size may be reduced by other means.

Once the cleaned and sorted superconducting particles are obtained, they are incorporated into the wire structure of the present invention. In one embodiment of the present invention a hollow metal tube is formed. The hollow metal tube is preferably formed of a flexible conducting metal material such as gold, silver, copper or aluminum.

Once the tube is formed, the interior of the tube is filled with the ceramic superconducting particles. The particles may be compressed within the tube as they are loaded. Alternatively, the wire containing the superconducting particles is drawn (at room or at elevated temperatures) through a die having a diameter smaller than the outside diameter of the tube. Thus, the tube is compressed around the superconducting particles as the wire is drawn through the die.

Another method of compacting the particles is to heat the wire and material, compact the material within the wire, and then allow the wire to cool. It is presently preferred to elevate the temperature of the wire to between approximately 200° C. to approximately 400° C. When cooled, the differential contraction between the metal tube and the material within the tube results in pressure being exerted on the particles.

A resulting wire 10 is illustrated in FIG. 1. FIG. 1 illustrates the hollow tube 12 filled with superconducting material 14. It will be appreciated that the superconducting material 14 is introduced into the interior of the tube 12 and compacted using one of the methods described above. FIG. 2 is a transverse cross-sectional view of the wire illustrated in FIG. 1. FIG. 2 shows wire 10 being formed from an exterior metallic tube 12 and an interior of superconducting ceramic 14.

The present invention provides a simple structure to overcome some complex problems. As mentioned above, the metal tube 12 provides a parallel conductive path to carry current in the case of a local loss of superconductivity within the interior of tube 12. Thus, if for any reason grain-to-grain contact is interrupted along the superconductor, the entire wire does not necessarily fail.

The metal tube 12 also provides thermal stabilization (heat sinking) to minimize local heating and to prevent loss of superconductivity. It will be appreciated from the discussion above that the temperature under which wire 10 operates is of critical importance. If the temperature rises to too high a level, superconductivity will cease.

Finally, the tube 12 provides mechanical protection for the ceramic. Tube 12 allows the ceramic to be molded more easily than would be the case for a sintered ceramic. Thus, wire 10 can be used in many settings in which conventional metallic wire is now used.

An alternative embodiment of the invention is illustrated in FIG. 3. Wire 16, which may be solid, is provided. Wire 16 is preferably formed of the conducting metals mentioned above. Wire 16 is then coated with particles 18 from the fluidized bed process described above. This coating process can be accomplished electrostatically.

For example, a voltage (V) is applied to the wire. The particles receive the acceleration (A) given by $$A = \frac{\epsilon_o V^2}{2\rho R^3 [\ln(a/b)]^2}, \qquad (1)$$

where ($\rho$) is the density of the superconducting compound, (R) is the distance between the wire 16 and the particle, (a) is the radius of the wire, and (b) is the radius of the chamber.

The other forces acting on the particles are the gravitational acceleration and the drag from the gas flow counteracting the gravity. In order for the electrostatic acceleration to be larger than the gravitational acceleration the following condition must be satisfied:

$$V^2 > \frac{2\rho g R^3 [\ln(a/b)]^2}{\epsilon_o}. \quad (2)$$

An example set of numbers are:

$\rho = 6 \times 10^3$ kg m$^{-3}$, g = 10 m sec$^{-2}$, R = 2×10$^{-4}$ m, a = 10$^{-4}$ m and b = 10$^{-1}$ m, which results in  (3)

$V > 2.1 \times 10^3$ volt.

The wire can be pulled continuously through the fluidized bed such that particles adhere to the surface and stay attached to the surface.

The importance of grain-to-grain contact in providing a superconducting wire can be readily appreciated. It is found the superconducting electrons can only travel approximately 17 to 20 angstroms unless there is direct surface contact between the grains. This phenomenon can be more fully appreciated with reference to FIG. 4.

In FIG. 4 two superconducting particles 20 and 20a are schematically illustrated, as is a non-superconducting impurity 22. As schematically illustrated in FIG. 3, particles 20 and 20a are generally spherical and generally contact at a point 24. In addition to point 24 there is an area over which the particles 20 and 20a are separated by a distance less than $\delta$. $\delta$, known as the superconducting coherence length, will most likely be in the range of from approximately 17 to approximately 20 angstroms, the theoretical distance over which a superconducting electron pair can travel. At any distance greater than $\delta$ the resistance is taken to be finite. The area that is separated by the distance $\delta$ or less is shown in FIG. 4 within the area defined by the broken lines.

In the case of the superconducting ceramic described above, critical current densities of approximately 10$^5$ A/cm$^2$ and 10$^6$ A/cm$^2$ in the c and a-b directions are respectively observed at 77° K. in zero applied magnetic field. It is found, however, that current densities of 10$^4$ A/cm$^2$ may be sufficient for applications with low magnetic field.

It is difficult to estimate the effective contact area between particles which are in fact of irregular shape. However, a simple scaling provides an order of magnitude estimate. This estimate is derived as follows:

When two spheres of the radius a are in contact, the solid angle $\alpha$, within which the surfaces are separated by less than $\delta$ is given by $$\alpha = \frac{(\delta/a)(1 - \delta/(2a))}{(1 + \delta/a)}. \quad (4)$$

A sphere occupies the solid angle $\pi(2-\sqrt{3})$ of the other sphere. Therefore, the fraction f of the surface closer to the surface of the neighboring sphere's surface than $\delta$ is given by $$f = \frac{1}{(2-\sqrt{3})} \frac{\delta}{a} \frac{(1-\delta/2a)}{(1+\delta/a)} \quad (5)$$

$$\approx 3.7 \frac{\delta}{a}$$

If we take $\delta$ to be 17Å and the average inherent critical density to be $(\frac{1}{3})\times 10^6 + (\frac{2}{3})\times 10^5 = 4 \times 10^5$ A/cm$^2$, the critical current density of the powder $J_c$ is given by $$J_c = 4 \times 10^5 \times \frac{63}{a(\text{Å})} \quad (6)$$

$$= \frac{2.5 \times 10^3}{a(\mu)} \text{ A/cm}^2.$$

To obtain $J_c = 10^4$ A/cm$^2$, the particle size should be smaller than a = 0.25μ.

Thus it can be seen that particles less than a certain size, such as 0.25μ, are required in order to provide the desired superconducting characteristics.

It will be appreciated that the present process avoids the necessity of sintering. When a particle is sintered, as discussed above, impurities within the superconducting material may interrupt the grain-to-grain contact of the superconducting particles. A schematic illustration of a sintered material is disclosed in FIG. 5. Again, two particles 20 and 20a are disclosed, along with an impurity 22. It can be seen that during sintering the impurity 22 became lodged between the particles 20 and 20a. Accordingly, there is little or no chance for high current density superconductivity between the two particles 20 and 20a because at most points on particles 20 and 20a there is separation by more than the superconducting coherence length.

Thus, it will be appreciated that the present invention is an advancement in the art in that sintering is not required at the early stages of formation of the superconducting material. However, once the wire is formed and the surfaces of the superconducting particles have been fully cleaned, it is possible to sinter the powder if desired. It is expected that sintering at a moderate temperature gives a good material in that the impurities have been removed.

Accordingly, the present invention accomplishes each of the objects set forth above. The present invention provides a superconducting wire which is made of a very pure material from which surface impurities have been removed. Accordingly, it is unnecessary to sinter the material early in the formation of the wire. This avoids problems with incorporating impurities between the grains of the superconducting ceramic (as illustrated in FIG. 5). That is, impurities will not coat the particles of superconducting ceramic.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A superconducting wire comprising:
    an elongated support structure; and
    a continuous layer of superconducting particles, each of said particles having a general formula MBa$_2$ CO$_3$ O$_{7-x}$, where M is yttrium or a rare earth element, and x is between approximately 0 and 0.2, a majority of said particles being no more than 20 (twenty) angstroms distant from its immediately adjacent particles, a majority of said particles having a radius equal to or less than approximately one-fourth (0.25) micron, the surface of said superconducting particles being cleansed by sputtering, said superconducting particles being disposed along said elongated support structure.

2. A superconducting wire as defined in claim 1 wherein said elongated support structure comprises a metal wire.

3. A superconducting wire as defined in claim 1 wherein said elongated support structure comprises a metal tube.

4. A superconducting wire as defined in claim 3 wherein said superconducting material is placed within said tube.

5. A superconducting wire, as defined in claim 4 wherein the diameter of said tube is reduced by being drawn at an elevated temperature.

6. A superconducting wire as defined in claim 1 wherein said elongated support structure is a conducting metal.

7. A superconducting wire as defined in claim 1 wherein said superconducting material is ceramic.

8. A superconducting wire as defined in claim 7 wherein said superconducting material has the general formula $MBa_2Cu_3O_{7-x}$, wherein x is in the range from approximately 0 to approximately 0.2, and wherein M is chosen from the group consisting of yttrium and the rare earth elements, except Ce, Pr and Tb.

9. A superconducting wire as defined in claim 8 wherein said superconducting material is $YBa_2Cu_3O_7$.

10. A superconducting wire structure comprising:
an elongated tube; and
particles of superconducting ceramic having been cleansed by sputtering, compressed within said tube, each of said particles having a copper general formula $MB_2\,CO_3\,O_{7-x}$, approximately 0 and 0.2, the spacing between the surface of a majority of immediately adjacent particles being less than approximately 20 (twenty) angstroms, a majority of said particles having a radius equal to or less than approximately one-quarter (0.25) microns.

11. A superconducting wire structure as defined in claim 10 wherein said elongated tube is made of a conducting metal.

12. A superconducting wire structure as defined in claim 10 wherein the ceramic is $YBa_2Cu_3O_7$.

* * * * *